United States Patent [19]

Okamoto et al.

[11] Patent Number: 5,023,748

[45] Date of Patent: Jun. 11, 1991

[54] CORONA WIRE CLEANING DEVICE FOR A CORONA UNIT

[75] Inventors: Sueaki Okamoto, Kyoto; Seitaro Yoshida, Osaka; Hiroshi Kageyama, Neyagawa; Shinji Ogaki, Kishiwada, all of Japan

[73] Assignee: Mita Industrial Co., Ltd., Osaka, Japan

[21] Appl. No.: 424,474

[22] Filed: Oct. 20, 1989

[30] Foreign Application Priority Data

Oct. 21, 1988 [JP] Japan ................................ 63-266881

[51] Int. Cl.[5] ...................... H01J 37/26; G03G 15/02

[52] U.S. Cl. .................................................. 361/229

[58] Field of Search .................. 361/229, 230, 262 A; 250/324, 325; 355/215

[56] References Cited

U.S. PATENT DOCUMENTS

| | | | |
|---|---|---|---|
| 3,842,273 | 10/1974 | Van Buskirk | 250/234 |
| O4,885,466 | 12/1989 | Koichi et al. | 250/325 |
| 4,908,513 | 3/1990 | Masuda et al. | 250/234 |

OTHER PUBLICATIONS

Patent Abstracts of Japan, vol. 11, No. 291, (P-618), [2738], Sep. 19, 1987.

Patent Abstracts of Japan, vol. 13, No. 309, (P-898), [3657], Jul. 14, 1989.

*Primary Examiner*—J. R. Scott
*Assistant Examiner*—Brian Johannssen
*Attorney, Agent, or Firm*—Armstrong, Nikaido, Marmelstein, Kubovcik, & Murray

[57] ABSTRACT

A corona wire cleaning device for a corona unit for cleaning corona wires stretched in a shield case, comprising: a driving wire wound on a driving pulley and an idle pulley for reciprocating motion along the length of the corona wire; and a cleaning member slidably mounted in the shield case for traveling motion in association with the reciprocating motion of the driving wire and having a cleaning tool which rubs and cleans the corona wire by the traveling motion thereof in one direction and which comes away from the corona wire by the traveling motion thereof in the other direction, whereby a foreign matter such as dust can be surely removed from the corona wire, thereby accomplishing reliable cleaning of the corona wire.

8 Claims, 6 Drawing Sheets

CORONA WIRE CLEANING DEVICE FOR A CORONA UNIT

BACKGROUND OF THE INVENTION

1. Field of the invention

The present invention relates to a corona wire cleaning device for a corona unit used, for example, as a charge unit, a transfer/separation unit, or the like, in an electrophotographic copying machine.

2. Description of the prior art

In an electrophotographic copying machine, a corona unit is used as a charge unit for uniformly charging the photoconductor. Usually, the corona unit includes a corona wire formed of tungsten, platinum, etc., stretched in a box-like shield case. In such a corona unit, when corona discharge is caused by the application of a high voltage, gas of silicon compounds containing silane or the like that is contained in the air surrounding the corona wire forms into a silicon oxide compound which adheres to the surface of the corona wire.

Adherence of the silicon oxide compound substantially impairs the discharging performance of the corona wire. Furthermore, for the corona unit used as a charge unit in an electrophotographic copying machine, adherence of paper dust and toner to the corona wire is also a problem since it reduces the discharging performance of the corona wire. If the discharging performance of the corona wire of the corona unit used as a charge unit is reduced, the photoconductor may not be charged uniformly, resulting in an uneven surface potential of the photoconductor and therefore, hampering formation of a clear image.

As a means to solve this problem, Japanese Laid-Open Patent Publication No. 62-86375, for example, discloses an automatic cleaning device for a corona unit which is used as a charge unit. In such an automatic cleaning device, a cleaning tool which rubs the corona wire, is coupled to a driving motor via a driving wire, the forward and reverse rotation of the driving motor driving the driving wire in the forward and backward direction to move the cleaning tool along the corona wire. While the driving wire is moved backward and forward, the cleaning tool rubs the corona wire to clean it. When the cleaning tool reaches either end of the corona wire, a sensor disposed in close proximity to the end is activated to stop the rotation of the driving motor.

The cleaning tool of this automatic cleaning device for a corona unit is in frictional contact with the corona wire both ways of the cleaning trip. Therefore, there is the possibility that, for example, the foreign material such as dust removed by the cleaning tool on the forward trip and stuck to the side thereof opposite from that facing the traveling direction will once again adhere to the cleaned corona wire during the backward trip of the cleaning tool.

The above automatic cleaning device for a corona unit is provided with a sensor to detect the cleaning tool reaching the prescribed position, and is so constructed that when the sensor has detected the cleaning tool reaching the prescribed position, the motor stops rotating. Since the cleaning tool is thus prevented from moving further when it has reached the prescribed position at the end of the corona wire, there is no possibility of the motor locking due to the application of excessive load. Furthermore, because of high tension applied to the driving wire, there is no possibility of the driving wire breaking. However, since the provision of a sensor is required in order to detect the cleaning tool reaching the prescribed position, there is a problem that the construction is not economical. Furthermore, there is a problem that the installation of the sensor to the prescribed position is troublesome.

In an electrophotographic copying machine, a corona unit is also used as a transfer/separation unit. The corona unit used as a transfer/separation unit usually comprises two wires stretched in one shield case, a corona wire for transfer and a corona wire for separation. If the above-mentioned automatic cleaning device is to be used for such a corona unit, it will be necessary to provide two driving motors, one each for driving the cleaning tool for cleaning one corona wire, and hence uneconomical in construction.

SUMMARY OF THE INVENTION

The corona wire cleaning device for a corona unit of the present invention, which overcomes the above-discussed and numerous other disadvantages and deficiencies of the prior art, comprises a driving wire wound on a driving pulley and an idle pulley for reciprocating motion along the length of the corona wire; and a cleaning member slidably mounted in the shield case for traveling motion in association with the reciprocating motion of the driving wire and having a cleaning tool which rubs and cleans the corona wire by the traveling motion thereof in one direction and which comes away from the corona wire by the traveling motion thereof in the other direction.

In a preferred embodiment, the corona unit is provided with a pair of corona wires, and the corona wires are simultaneously cleaned by means of a pair of cleaning tools provided on a single cleaning member.

In a preferred embodiment, the corona unit is provided with a pair of corona wires, and the respective corona wires are cleaned by means of respective cleaning tools provided on a pair of cleaning members moving in opposite directions from each other by the traveling motion of the driving wire in a given direction.

In a preferred embodiment, one of the cleaning tools is in frictional contact with the corresponding corona wire and the other cleaning tool is out of contact with the other one of the corona wires when the driving wire moves in a given direction.

In a preferred embodiment, the travel of the driving wire is limited at least in one direction at a point near the idle pulley on which the driving wire is applied. In a more preferred embodiment, the travel of the driving wire for moving the cleaning member in the direction away from the driving pulley is limited when a section of the driving wire moving in the same direction as the cleaning member abuts a specified limiting member. In a more preferred embodiment, the travel of the driving wire for moving the cleaning member in the direction toward the driving pulley is limited when a section of the driving wire moving in the opposite direction from the cleaning member abuts a specified limiting member.

In a preferred embodiment, the cleaning member comprises a support frame slidably mounted in the shield case, a support lever swingably supported in the support frame, a cleaning tool mounted on one end of the support lever and coming in or out of contact with the corona wire by the swinging motion of the support lever, and the driving wire is provided with a pair of operating members which are engaged with the other end of the support lever by the traveling motion of the driving wire in respective directions to pull the entire cleaning member with the support lever swung in the respective directions.

Thus, the invention described herein makes possible the objectives of (1) providing a corona wire cleaning device for a corona unit that is simple in construction and that is capable of stopping a cleaning tool without locking the motor that is the driving source for moving the cleaning tool; (2) providing a corona wire cleaning device for a corona unit in which the cleaning tool moving back and forth along the corona wire is brought in frictional contact with the corona wire during the travel in one direction only, so that a foreign matter such as dust can be surely removed from the corona wire, thereby accomplishing reliable cleaning of the corona wire; (3) providing a corona wire cleaning device for a corona unit by which a reliable cleaning of each corona wire using only one motor can be attained even when two corona wires are disposed in its shield case; and (4) providing a corona wire cleaning device for a corona unit wherein when the construction is such that the traveling motion of the driving wire for driving the cleaning tool is limited and stopped at a position backward of a position adjacent to the idle pulley for the driving wire, even though high tensile force is applied to the driving wire by the pulling force of the driving pulley while the traveling motion of the driving wire is being limited, the tensile force is absorbed in the elongation of the driving wire because a portion of the driving wire subjected to the tensile force is sufficiently long, and therefore, there is no possibility of excessive load being applied to the driving source; as a result, it is possible to stop the driving wire without the possibility of breaking it and without using a special sensor or the like to stop the driving motor when the driving wire has reached the prescribed position.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
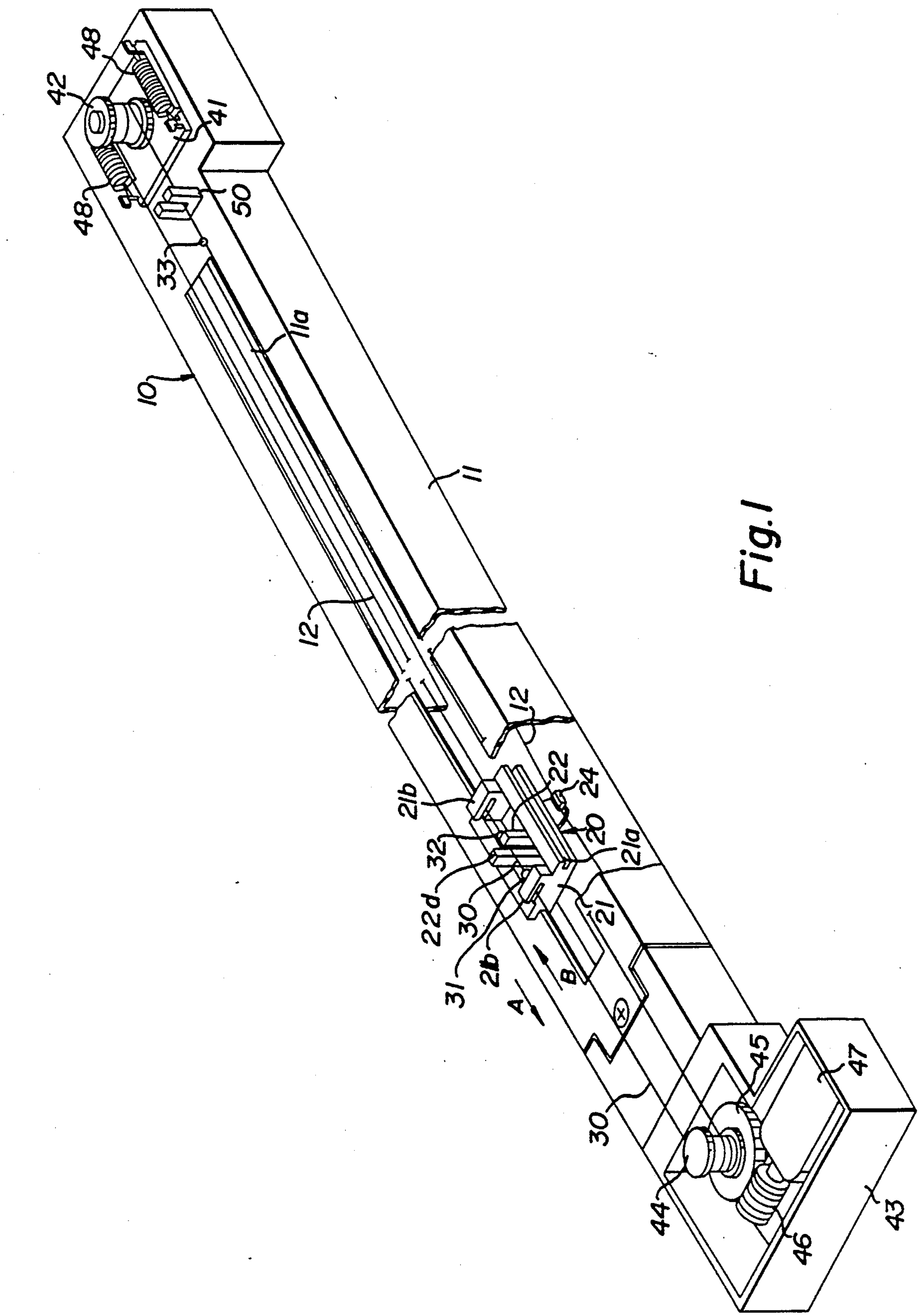
FIG. 1 is a perspective view showing a corona unit having the corona wire cleaning device of the present invention.

FIG. 1 is a corona unit in which the corona wire cleaning device of the present invention is installed. The corona unit 10 is used, for example, as a charge unit in an electrophotographic copying machine. The corona unit 10 includes a shield case 11 having the shape of a rectangular parallelepiped, and a pair of corona wires 12 and 12 stretched in the shield case 11 along the longitudinal length thereof. The shield case 11 has an open side (bottom), and an end block (not shown) is fitted to each end thereof. The ends of each corona wire 12 are fixed within the respective end blocks. Provided in the side (top) of the shield case 11 opposite the open side is an elongated opening 11*a* extending parallel to the corona wires 12 and 12 stretched in the shield case 11.

The corona wire cleaning device of the present invention comprises a cleaning member 20 which moves along the elongated opening 11*a* in the shield case 11 of the corona unit 10, and a driving wire 30 which moves the cleaning member 20 along the elongated opening 11*a*. The driving wire 30 is applied on an idle pulley 42 mounted, with a support plate 41 interposed, on the upper surface of one end of the shield case 11, and is wound on a driving pulley 44 disposed in a motor box 43 connected to the other end of the shield case 11. The driving wire 30 has two sections stretched parallel to each other between the driving pulley 44 and the idle pulley 42, one section thereof being stretched facing the elongated opening 11*a* of the shield case 11. Several turns of driving wire 30 is wound on the driving pulley 44. The driving pulley 44 is mounted on a pinion gear 45 disposed in the motor box 43, and rotates integrally with the pinion gear 45. The pinion gear 45 is engaged with a worm gear 46 which is connected to the output shaft of a driving motor 47 disposed in the motor box 43. The driving motor 47 is capable of rotating in both forward and reverse directions.

The idle pulley 42 on which the driving wire 30 is applied at the other end of the shield case 11 is rotatably installed on the support plate 41 mounted slidably on the upper surface of the end of the shield case 11. There are also disposed a pair of tension springs 48 and 48, one end of each being fixed to the support plate 41 and the other end to the upper surface of the end of the shield case 11 so as to exert force to pull the support plate 41 in the direction opposite to a position where the driving pulley 44 is disposed. Therefore, the idle pulley 42 is always pulled by the pair of tension springs 48 and 48 via the support plate 41 in the direction opposite to the position where the driving pulley 44 is disposed, and any variation in the tensile force applied to the driving wire 30 is absorbed by the tension springs 48 and 48.

Figure 2:
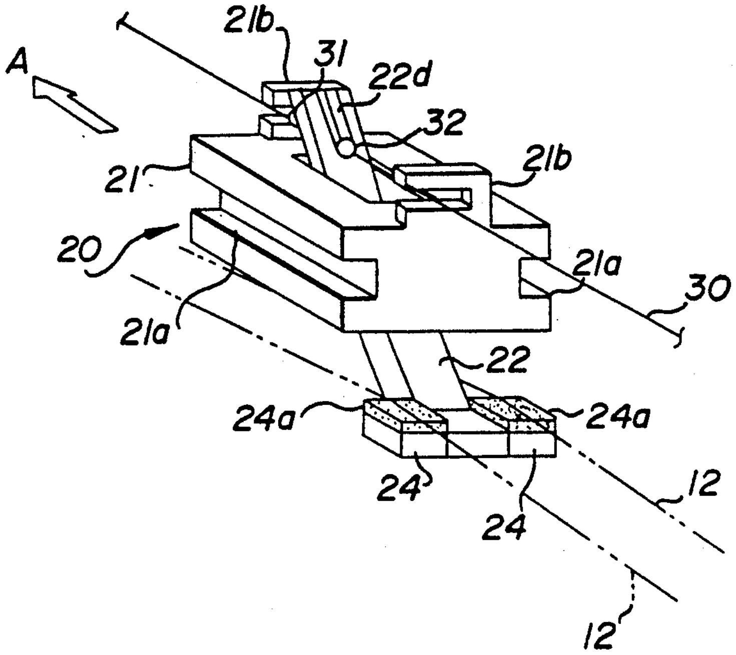
FIG. 2 is a perspective view showing a cleaning member of the cleaning device shown in FIG. 1.
Figure 3:
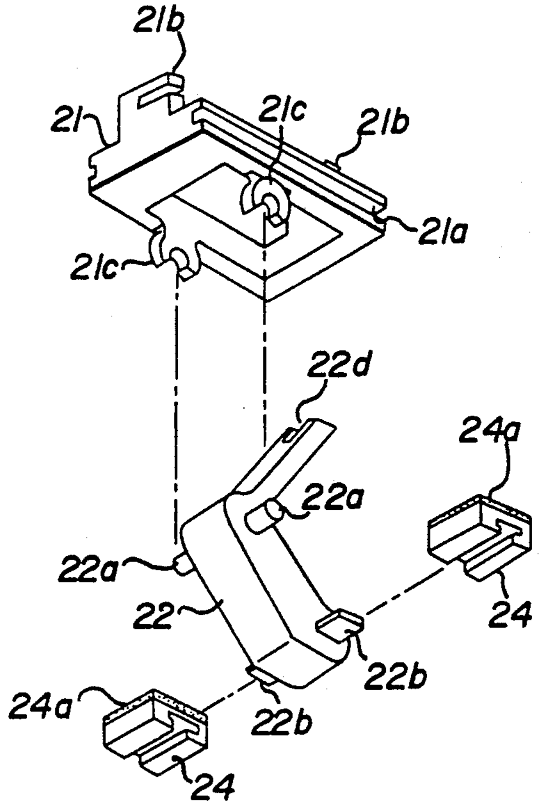
FIG. 3 is a perspective view showing a decomposition of the cleaning member of FIG. 2.

The cleaning member 20 installed on the driving wire 30 includes, as shown in FIGS. 2 and 3, a support frame 21 having the shape of a rectangular parallelepiped, and a support lever 22 swingably mounted on the support frame 21. A guide groove 21*a* is formed on each of the sides of the support frame 21 that extend along the longitudinal length of the elongated opening 11*a*. The guide grooves 21*a* and 21*a* slidably engage the respective longitudinal edges of the elongated opening 11*a* of the shield case 11.

The upper surface of the support frame 21 is positioned above the shield case 11, and on each of the ends of the upper surface facing the respective moving directions of the support frame 21, there are provided engaging portions **21*b* and 21*b* projecting upwardly thereof. Each engaging portion 21*b* has a U-shaped form with an open side, through which the driving wire 30** passes.

The support lever 22 bent in a doglegged form is disposed through the support frame 21. The upper end of the support lever 22 projects above the upper surface of the support frame 21, while the lower end thereof projects below the underside of the support frame 21 positioned inside the shield case 11. At the bend of the support lever 22 are provided a pair of support pins **22*a* and 22*a* projecting sideward as shown in FIG. 3. The support lever 22 is rotatably supported via the pair of support pins 22*a* and 22*a* on a pair of bearings 21*c* provided on the underside of the support frame 21, so that when the upper arm thereof is positioned approximately perpendicular with respect to the support frame 21, the lower arm is positioned to point toward the idle pulley 42. In the upper end of the support lever 22 projecting above the upper surface of the support frame 21, there is formed a vertically elongated cutout 22*d* through which the driving wire 30 passes. On the other hand, on the lower end of the support lever 22 projecting below the underside of the support frame 21, there are formed a pair of tenons 22*b* and 22*b* projecting sideward onto each of which a cleaning tool 24 is fitted. The cleaning tools 24 and 24, respectively, are positioned facing the corona wires 12 provided with a cleaning part 24*a* on the upper surface thereof facing the corresponding corona wire 12. By the swinging motion of the support lever 22, the cleaning part 24*a* of each cleaning tool 24 is brought in contact with the corresponding corona wire 12** to rub it for cleaning.

The support lever 22 is bent so that its lower arm points toward the direction opposite from the driving pulley 44, and when the upper arm of the support lever 22 is tilted toward the driving pulley 44, the cleaning parts **24*a* and 24*a* of the cleaning tools 24 and 24 provided on the lower arm are caused to swing upward coming in contact with the respective corona wires 12 and 12. Conversely, when the upper arm of the support lever 22 is tilted toward the idle pulley 42, the cleaning parts 24*a* and 24*a* of the cleaning tools 24 and 24 are caused to swing downward coming away from the respective corona wires 12 and 12**.

The driving wire 30 passing through the engaging portions **21*b* and 21*b* provided on the upper surface of the support frame 21 also passes through the cutout 22*d* in the upper end of the support lever 22 between the two engaging portions 21*b* and 21*b*. Also, a spherically-shaped operating member 31 is provided on a portion of the driving wire 30 positioned between the engaging portion 21*b* nearer to the driving pulley 44 and the cutout 22*d* in the support lever 22, while another spherically-shaped operating member 32 is provided on a portion of the driving wire 30 positioned between the engaging portion 21*b* nearer to the idle pulley 42 and the cutout 22*d* in the support lever 22. Both the operating members 31 and 32 have a larger size than that of the cutout 22*d* in the upper end of the support lever 22 so that they do not pass therethrough but stop at the support lever 22. Both the operating members 31 and 32 also have a larger size that cannot pass through the engaging portions 21*b* and 21*b* so that they stop at the respective engaging portions 21*b* and 21*b***.

The operating members 31 and 32 work in the following way. When the driving wire 30 is moved toward the driving pulley 44 (in the direction indicated by arrow A in FIG. 1), the operating member 32 positioned farther from the driving pulley 44 (nearer to the idle pulley 42) stops at the upper end of the support lever 22, causing the upper arm of the support lever 22 to tilt toward the driving pulley 44. At this time, the operating member 31 positioned nearer to the driving pulley 44 stops at the engaging portion **21*b* that faces the driving pulley 44. When the support lever 22 is thus tilted, the cleaning parts 24*a* and 24*a* on the cleaning tools 24 and 24 mounted on the lower arm of the support lever 22 are brought in contact with the respective corona wires 12 and 12. In this situation, when the driving wire 30 is further moved in direction A, the operating member 32 positioned nearer to the idle pulley 42 pushes the upper arm of the support lever 22 toward the driving pulley 44. This causes the entire cleaning member 20 to move toward the driving pulley 44 with the cleaning tools 24 mounted on the lower arm of the support lever 22 contacting the respective corona wires 12 and 12. When the driving wire 30 is thus moved, the cleaning parts 24*a* and 24*a* on the cleaning tools 24 and 24 rub and clean the respective corona wires 12 and 12**.

Conversely, when the portion of the driving wire 30 on which the cleaning member 20 is installed is moved toward the idle pulley 42 (in the direction indicated by arrow B in FIG. 1), the operating member 32 nearer to the driving pulley 44 comes off the support lever 22, letting the upper arm of the support lever 22 to tilt by its own weight in the direction moving away from the driving pulley 44. This causes the cleaning tools 24 and 24 mounted on the lower arm of the support lever 22 to swing downward coming off the corona wires 12 and 12. When the driving wire 30 is further moved in direction B, the operating member 32 positioned nearer to the idle pulley 42 pushes the engaging portion **21*b* facing the idle pulley 42 in the direction moving away from the driving pulley 44. This causes the entire cleaning member 20 to travel in the direction moving away from the driving pulley 44 with the cleaning tools 24 and 24 mounted on the lower arm of the support lever 22 staying out of contact with the corona wires 12 and 12**.

On the upper surface of the end of the shield case 11 where the idle pulley 42 is mounted, there is provided a U-shaped limiting member 50 with an open upper end. The section of the driving wire 30 stretched between the driving pulley 44 and the idle pulley 42 and not facing the elongated opening **11*a* of the shield case 11 passes through the limiting member 50. The limiting member 50 is positioned nearer to the idle pulley 42 than to the elongated opening 11*a* provided in the upper surface of the shield case 11. On the section of the driving wire 30 that passes through the limiting member 50, there is provided a spherically-shaped stop member 33 which comes to stop at the limiting member 50. The stop member 33 is provided at a prescribed position so that it stops at the limiting member 50 just before the cleaning member 20 being pulled by the driving wire 30 along the elongated opening 11*a* of the shield case 11 toward the driving pulley 44 reaches the end of the elongated opening 11*a* nearer to the driving pulley 44**.

Figure 4A:
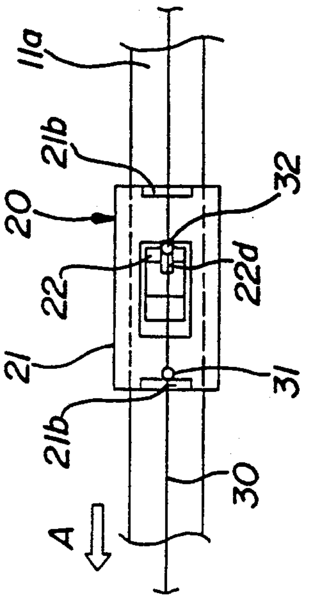
FIGS. 4*a* and 4*b*, respectively, are a plan view and a side view showing a main part of the corona wire cleaning device of FIG. 1 to explain the operation thereof.
Figure 4B:
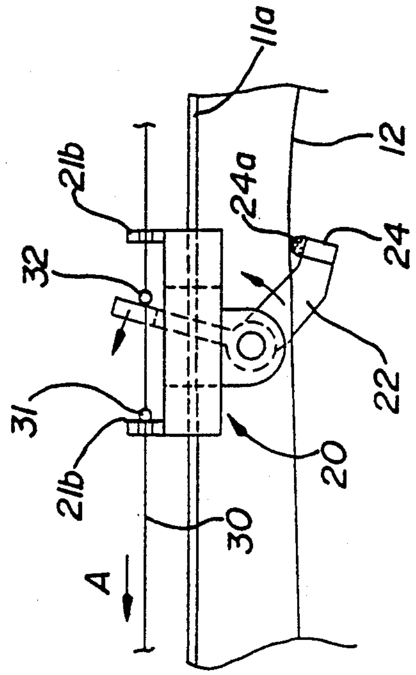

The corona wire cleaning device of the above construction works in the following manner. At the beginning, the cleaning member 20 is positioned at the end of the elongated opening **11*a* of the shield case 11 nearer to the idle pulley 42, and in this situation, the driving motor 47 is started for forward rotation. By the forward rotation of the driving motor 47, the section of the driving wire 30 facing the elongated opening 11***a* is moved toward the driving pulley 44, as shown in FIGS. 4*a* and 4*b*. This causes the operating member 32 provided on the driving wire 30 at a position nearer to the idle pulley 42 to push the upper arm of the support lever 22, causing the lower arm of the support lever 22 to swing upward, and thus the cleaning parts 24*a* and 24*a* of the cleaning tools 24 an 24 provided on the lower arm to contact the respective corona wires 12 and 12. At the same time, the operating member 31 nearer to the driving pulley 44 abuts the engaging portion 21*b* formed on the support frame 21 of the cleaning member 20 and facing the driving pulley 44 to move the entire cleaning member 20 toward the driving pulley 44 along the elongated opening 11*a* of the shield case 11. This causes the cleaning parts 24*a* and 24*a* on the cleaning tools 24 and 24 to rub the corona wires 12 and 12 for cleaning thereof. The operating time of the driving motor 47 is a slightly longer than that needed for the cleaning member 20 to travel the entire length of the elongated opening 11*a* of the shield case 11.

Thus, the entire cleaning member 20 moves in the elongated opening 11*a* of the shield case 11 till reaching the vicinity of the end of the elongated opening 11*a* nearer to the driving pulley 44. At this time, the stop member 33 provided on the section of the driving wire 30 moving away from the driving pulley 44 toward the idle pulley 42 stops at the limiting member 50 provided on the end of the shield case 11 where the idle pulley 42 is mounted, just before the cleaning member 20 reaches the end of the elongated opening 11*a* nearer to the driving pulley 44. As a result, the driving wire 30 is prevented from moving further although the driving motor 47 is still being driven for forward rotation.

Figure 5:
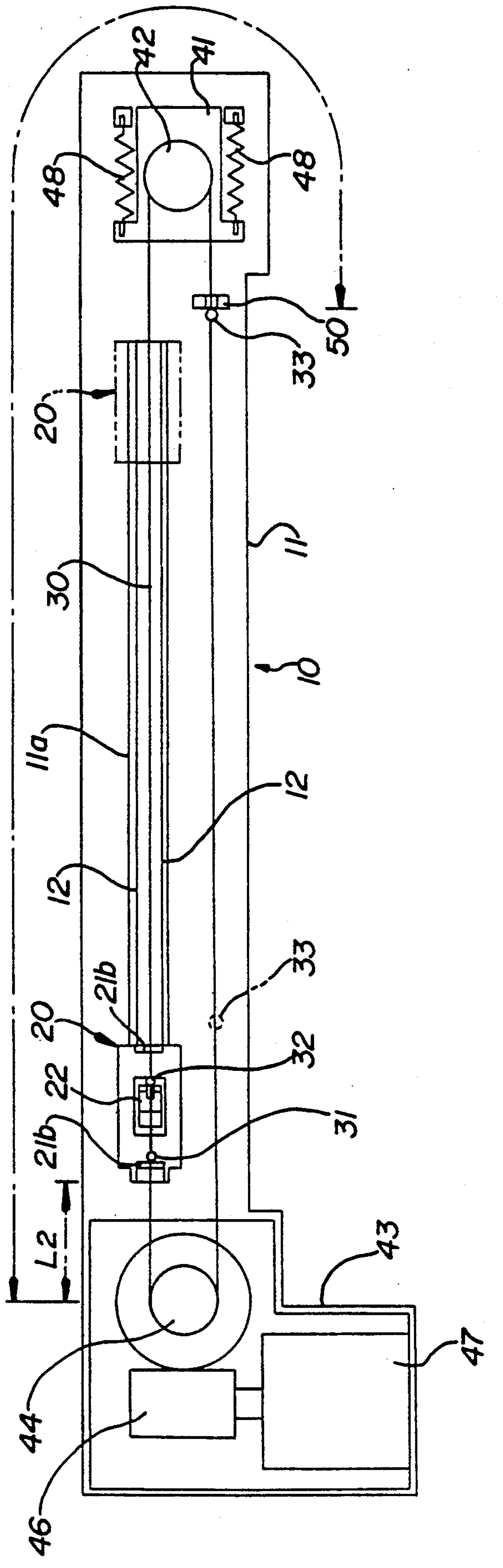
FIG. 5 is a diagrammatic plan view showing the whole construction of the cleaning device of FIG. 1.

At this time, the portion of the driving wire 30 stretched via the idle pulley 42 from where it is stopped at the limiting member 50 to where it is wound on the driving pulley 44 (the portion indicated by L1 in FIG. 5) is pulled by the driving pulley 44, and the tensile force being exerted by the forward rotation of the driving motor 47 is therefore applied to that portion of the driving wire 30. The portion of the driving wire 30 subjected to the tensile force at this time is sufficiently longer, for example, than the portion thereof (indicated by L2 in FIG. 5) to which tensile force is applied when the driving wire 30 is prevented from moving further with the cleaning member 20 stopped at the end of the elongated opening 11*a* nearer to the driving pulley 44. Therefore, the tensile force applied to the driving wire 30 is absorbed in the elongation along the entire length of the portion of the driving wire 30 indicated by L1 in FIG. 5, thereby preventing the driving motor 47 from locking and also, the driving wire 30 from breaking. When a certain time has passed after that, the driving motor 47 is stopped temporarily.

Figure 6A:
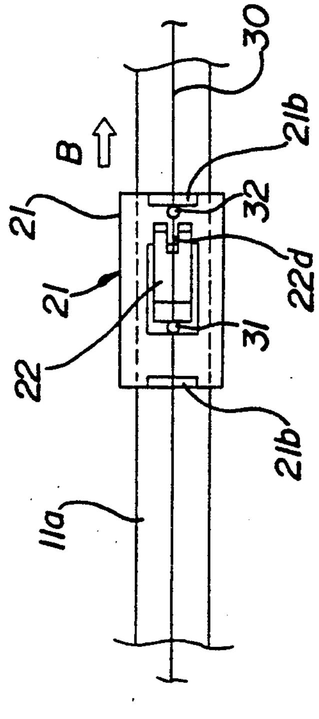
FIGS. 6*a* and 6*b*, respectively, are a plan view and a side view showing a main part of the corona wire cleaning device of FIG. 1 to explain the operation thereof.
Figure 6B:
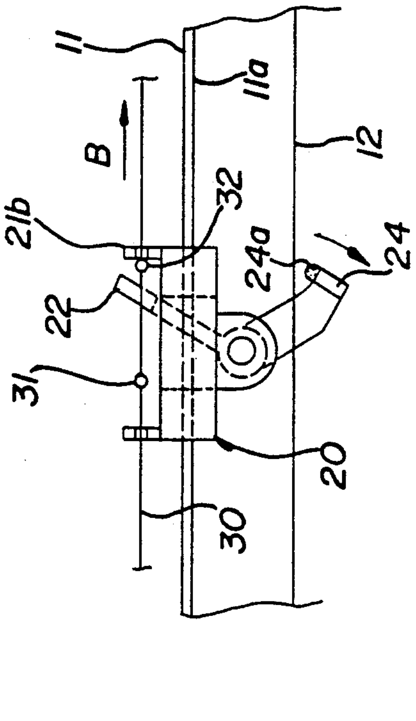

Thereafter, the driving motor 47 is started for reverse rotation so that the section of the driving wire 30 facing the elongated opening 11*a* starts to move toward the idle pulley 42, as shown in FIGS. 6*a* and 6*b*. This causes the operating member 31 provided on the driving wire 30 at a position nearer to the driving pulley 44 to push the upper arm of the supporting lever 22 toward the idle pulley 42, which in turn causes the lower arm of the support lever 22 to swing downward with the cleaning parts 24*a* and 24*a* on the cleaning tools 24 and 24 mounted on the lower arm coming out of contact with the corona wires 12 and 12. At the same time, the operating member 32 nearer to the idle pulley 42 abuts the engaging portion 21*b* formed on the support frame 21 of the cleaning member 20 and facing the idle pulley 42 to move the entire cleaning member 20 along the elongated opening 11*a* of the shield case 11 toward the idle pulley 42.

While the entire cleaning member 20 is thus being moved in the elongated hole 11*a* toward the idle pulley 42, the cleaning tools 24 and 24 are not in contact with the corona wires 12 and 12, therefore, no cleaning of the corona wires 12 and 12 is performed. When the cleaning member 20 reaches the position indicated by a two-dot chain line in FIG. 5 at the end of the elongated opening 11*a* nearer to the idle pulley 42, the cleaning member 20 is stopped at the end of the elongated opening 11*a*, the further travel thereof being limited.

At this time, also, the portion of the driving wire 30 which is pulled by the driving pulley 44 with application of tensile force is sufficiently long to prevent the driving motor 47 from locking and thus, the driving wire 30 from breaking. When a certain time has elapsed, the driving motor 47 is stopped to complete the cleaning of the corona wires 12 and 12.

Example 2

Figure 7:
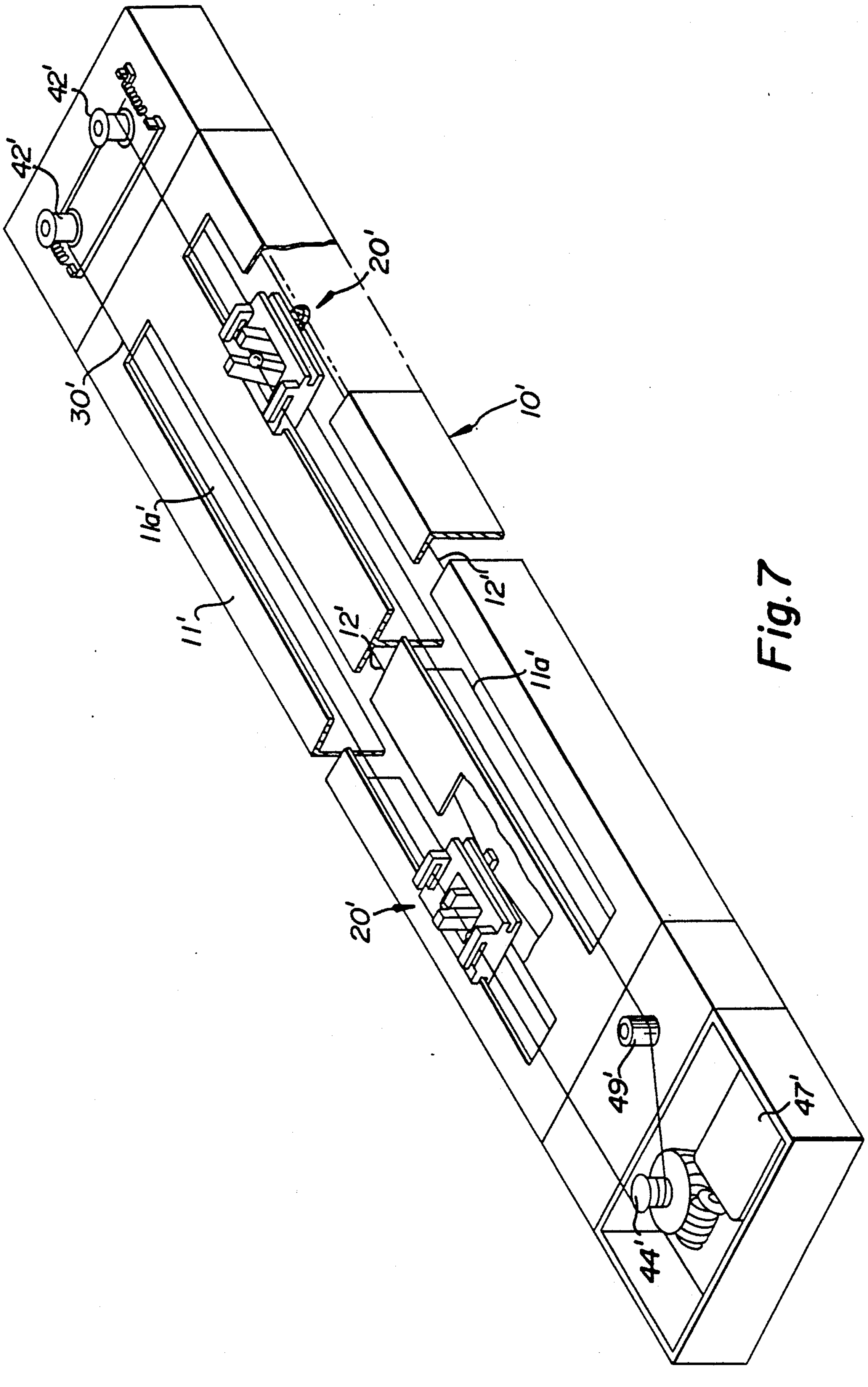
FIG. 7 is a perspective view showing a corona unit having another corona wire cleaning device of the present invention.
Figure 8:
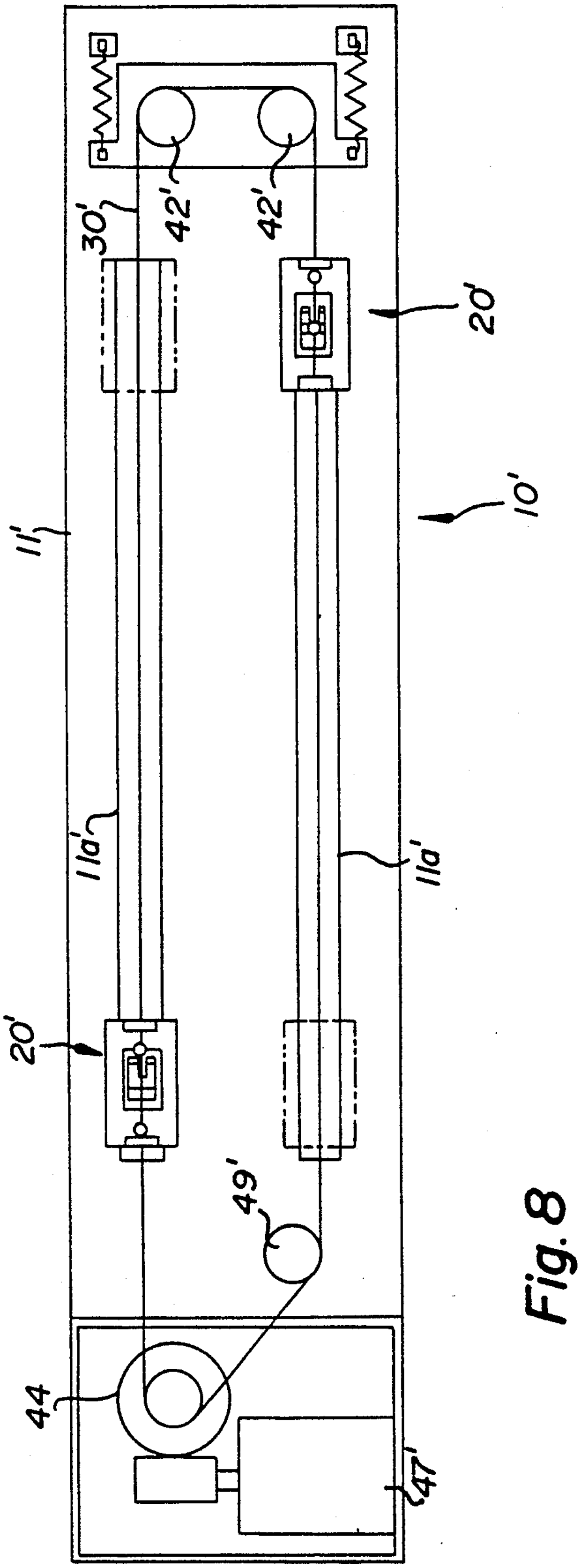
FIG. 8 is a diagrammatic plan view showing the operation of the cleaning device of FIG. 7.

FIGS. 7 and 8 show another corona wire cleaning device of the present invention. A corona unit 10' is, for example, a transfer/separation unit used in an electrophotographic copying machine, and includes two corona wires 12' and 12' stretched in a shield case 11'. The shield case 11' is provided with a pair of elongated openings 11*a'* and 11*a'* facing the respective corona wires 12'. In this embodiment, a pair of cleaning members 20' and 20' are provided for cleaning the respective corona wires 12' and 12'. The cleaning members 20' and 20', respectively, move along the elongated openings 11a' and 11a' provided in the shield case 11'. The two cleaning members 20' and 20' are simultaneously moved by a driving wire 30' which is wound on a driving pulley 44' and which is applied on a pair of idle pulleys 42' and 42' provided on the opposite end of the shield case 11' from the driving pulley 44' and a tension pulley 49' disposed at the end nearer to the driving pulley 44'. Therefore, when one cleaning member 20' moves toward the idle pulleys 42', the other cleaning member 20' moves toward the driving pulley 44'. The driving wire 30' is driven by a driving motor 47'.

In this embodiment, the cleaning members 20' and 20' have the same construction as the cleaning member 20 in the foregoing embodiment except that each has only one cleaning tool 24' which contacts the corresponding corona wire 12', therefore, the description thereof is omitted herein. The cleaning tool 24' of the cleaning member 20' moving toward the idle pulleys 42' and 42' rubs the corresponding corona wire 12', while the cleaning tool 24' of the cleaning member 20' moving toward the driving pulley 44' is not in contact with the corresponding corona wire 12'. Therefore, when one cleaning member 20' travels in the direction moving away from the idle pulleys 42' and 42' toward the driving pulley 44', its cleaning tool 24' contacts the corresponding corona wire 12' for cleaning thereof, while the other cleaning member 20' travels in the direction moving away from the driving pulley 44' toward the idle pulleys 42' and 42' without contacting its corresponding corona wire 12'.

In this embodiment, the mounting position of each cleaning member 20' is so determined with respect to the driving pulley 44' that either one of the cleaning members 20' will reach the end of the elongated opening 11a' nearer to the idle pulleys 42' and 42' just before the other cleaning member 20' moving along the other elongated opening 11a' toward the driving pulley 44' reaches the end of the elongated opening 11a' nearer to the driving pulley 44'. Therefore, when either one of the cleaning members 20' reaches the end of the elongated opening 11a' nearer to the idle pulleys 42' and 42' to stop the traveling motion of the driving wire 30', the portion of the driving wire 30' stretched from that end via the pair of idle pulleys 42' and 42' to the driving pulley 44' is subjected to the tensile force by the driving of the driving motor 47'. However, since the portion of the driving wire 30' subjected to the tensile force is sufficiently long, the tensile force is absorbed in the elongation of the driving wire 30' along the length of that portion, thereby preventing the driving motor 47' from locking and also, the driving wire 30' from breaking.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

We claim:

1. A corona wire cleaning device for a corona unit for cleaning corona wires stretched in a shield case, comprising:

a driving wire around on a driving pulley and an idle pulley for reciprocating motion along the length of the corona wire; and a cleaning member slidably mounted in the shield case for traveling motion in association with the reciprocating motion of the driving wire and having a cleaning tool which rubs and cleans the corona wire by the traveling motion thereof in one direction and which comes away from the corona wire by the traveling motion thereof in the other direction, said cleaning member having a support lever swingably mounted thereon.

2. A corona wire cleaning device for a corona unit according to claim 1, wherein said corona unit is provided with a pair of corona wires, and the corona wires are simultaneously cleaned by means of a pair of cleaning tools provided on a single cleaning member.

3. A corona wire cleaning device for a corona unit having a pair of corona wires stretched in a shield case, comprising:

a driving wire wound on a driving pulley and an idle pulley for reciprocating motion along the length of the corona wire; and a pair of cleaning members slidably mounted in the shield case for traveling motion in opposite directions from each other in association with the reciprocating motion of the driving wire in a given direction and having respective cleaning tools on said cleaning members which rub and clean the corona wires by the traveling motion thereof in one direction and which come away from the corona wires by the traveling motion thereof in the other direction, said cleaning members moving in opposite directions from each other by the traveling motion of the driving wire in a given direction.

4. A corona wire cleaning device for a corona unit according to claim 3, wherein one of the cleaning tools is in frictional contact with the corresponding corona wire and the other cleaning tool is out of contact with the other one of the corona wires when the driving wire moves in a given direction.

5. A corona wire cleaning device for a corona unit according to claim 1, wherein said travel of the driving wire is limited at least in one direction at a point near the idle pulley on which the driving wire is applied.

6. A corona wire cleaning device for a corona unit according to claim 5, wherein said travel of the driving wire for moving the cleaning member in the direction away from the driving pulley is limited when a section of the driving wire moving in the same direction as the cleaning member abuts a specified limiting member.

7. A corona wire cleaning device for a corona unit according to claim 6, wherein said travel of the driving wire for moving the cleaning member in the direction toward the driving pulley is limited when a section of the driving wire moving in the opposite direction from the cleaning member abuts a specified limiting member.

8. A corona wire cleaning device for a corona unit according to claim 1, wherein said cleaning member comprises a support frame slidably mounted in the shield case, a support lever swingably supported in the support frame, a cleaning tool mounted on one end of the support lever and coming in or out of contact with the corona wire by the swinging motion of the support lever, and the driving wire is provided with a pair of operating members which are engaged with the other end of the support lever by the traveling motion of the driving wire in respective directions to pull the entire cleaning member with the support lever swung in the respective directions.

* * * * *